United States Patent
Holmes et al.

(10) Patent No.: US 6,459,577 B1
(45) Date of Patent: Oct. 1, 2002

(54) THERMAL CHIMNEY FOR A COMPUTER

(75) Inventors: Steve Holmes, Mountain View, CA (US); Wayne Miller, Los Altos, CA (US); Girish Upadhya, San Jose, CA (US); Richard Smith, San Jose, CA (US)

(73) Assignee: Apple Computer, Inc., Cupertino, CA (US)

( * ) Notice: Subject to any disclaimer, the term of this patent is extended or adjusted under 35 U.S.C. 154(b) by 0 days.

(21) Appl. No.: 09/899,553

(22) Filed: Jul. 6, 2001

(51) Int. Cl.[7] ................................................. H05K 7/20
(52) U.S. Cl. ...................... 361/690; 361/703; 361/704; 165/80.3; 257/722; 454/184
(58) Field of Search .................................. 361/683–687, 361/690–692, 695, 697–699, 704–710; 174/16.1, 16.3; 165/80.3, 185, 104.33

(56) References Cited

U.S. PATENT DOCUMENTS

| | | | | |
|---|---|---|---|---|
| 3,961,666 A | * | 6/1976 | Suzuki et al. ............... | 165/129 |
| 4,535,386 A | * | 8/1985 | Frey, Jr. et al. ............. | 361/714 |
| 4,858,069 A | * | 8/1989 | Hughes ....................... | 361/696 |
| 5,008,775 A | * | 4/1991 | Schindler et al. ........... | 361/681 |
| 5,513,071 A | * | 4/1996 | LaViolette et al. ......... | 361/703 |
| 5,596,483 A | * | 1/1997 | Wyler ......................... | 361/683 |
| 5,894,407 A | * | 4/1999 | Aakalu et al. .............. | 361/695 |
| 5,912,803 A | * | 6/1999 | Dahl et al. .................. | 361/704 |
| 6,088,225 A | * | 7/2000 | Parry et al. ................. | 361/704 |
| 6,175,494 B1 | * | 1/2001 | Komatsu .................... | 361/692 |
| 6,324,056 B1 | * | 11/2001 | Breier et al. ................ | 361/687 |

\* cited by examiner

*Primary Examiner*—Boris Chervinsky
(74) *Attorney, Agent, or Firm*—Burns Doane Swecker & Mathis, L.L.P.

(57) ABSTRACT

A heat removal system for a computer comprising a casing enclosing a hard drive and a microprocessor, the casing including an opening in an exterior surface thereof; a heat sink positioned between the hard drive and the microprocessor, the heat sink being aligned with the opening in the casing so as to form a thermal chimney; and a spreader plate disposed between the microprocessor and the heat sink, the spreader plate conducting heat from the microprocessor to the heat sink.

21 Claims, 3 Drawing Sheets

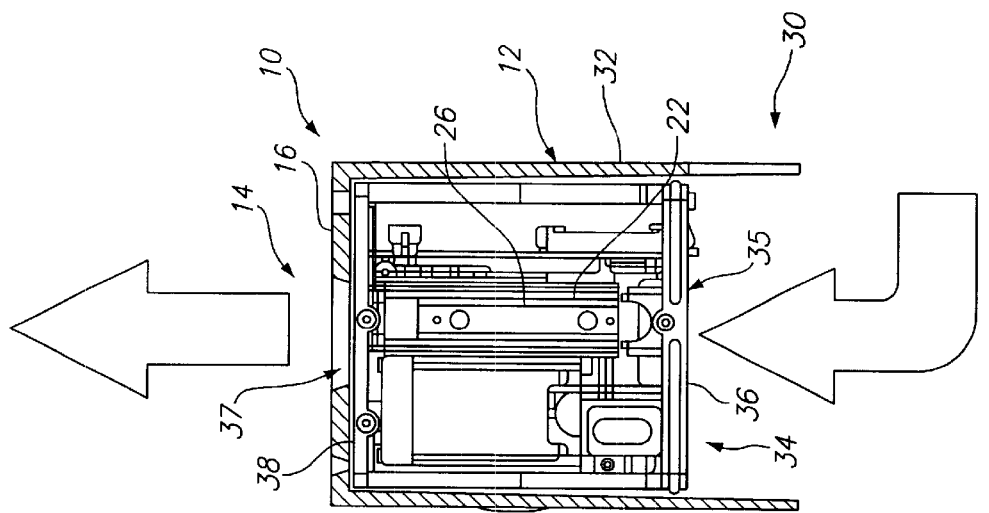
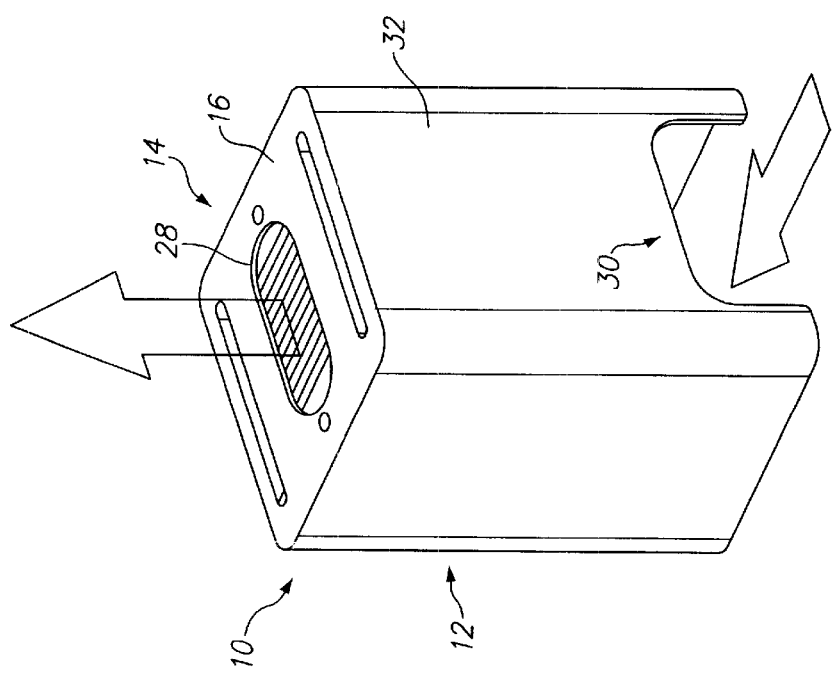
FIG. 1A
FIG. 1B

THERMAL CHIMNEY FOR A COMPUTER

BACKGROUND OF THE INVENTION

1. Field of the Invention

The present invention relates generally to a heat removal system for computer systems, and more specifically, to a heat removal system using a heat sink and a thermal chimney.

2. Brief Description of the Related Art

It is generally an accepted principle that computer systems generate heat during operation. It is also well known that when excessive heat occurs inside a computer system, there is a potential for damage to the components and possibly even irrecoverable disabling of the system. Accordingly, it is desirable to provide a method of removing heat from a computer system and one of the most common methods which has been used is a fan which forces air across hot components and directs the heated air out of the computer system.

Forced air convection systems, such as those using fans, have several disadvantages. Fans are loud and are distracting to the computer user. Fans also take up valuable space in computer systems and must be strategically placed in order to function properly. Further, fans draw available power away from the computer system and thus decrease the overall efficiency thereof.

There therefore remains a need in the art to provide a computer system with a more effective heat removal system, which functions without disturbing the user and facilitates a computer system with a more compact design and high efficiency.

SUMMARY OF THE INVENTION

According to an exemplary embodiment of the invention, a heat removal system for a computer system comprises a casing enclosing a hard drive and a microprocessor, said casing including an opening in an exterior surface thereof; a heat sink positioned between the hard drive and the microprocessor, said heat sink being aligned with said opening in the casing so as to form a thermal chimney; and a spreader plate disposed between the microprocessor and said heat sink, said spreader plate conducting heat from the microprocessor to said heat sink.

Still other objects, features, and attendant advantages of the present invention will become apparent to those skilled in the art from a reading of the following detailed description of embodiments constructed in accordance therewith, taken in conjunction with the accompanying drawings.

BRIEF DESCRIPTION OF THE DRAWINGS

The invention of the present application will now be described in more detail with reference to preferred embodiments of the apparatus, given only by way of example, and with reference to the accompanying drawings, in which:

FIG. 1A is a perspective, schematic view of a computer including an embodiment of the heat removal system of the present invention; and FIG. 1B is a cross-sectional schematic view of the heat removal system of FIG. 1A;

DESCRIPTION OF THE PREFERRED EMBODIMENTS

Figure 2B:
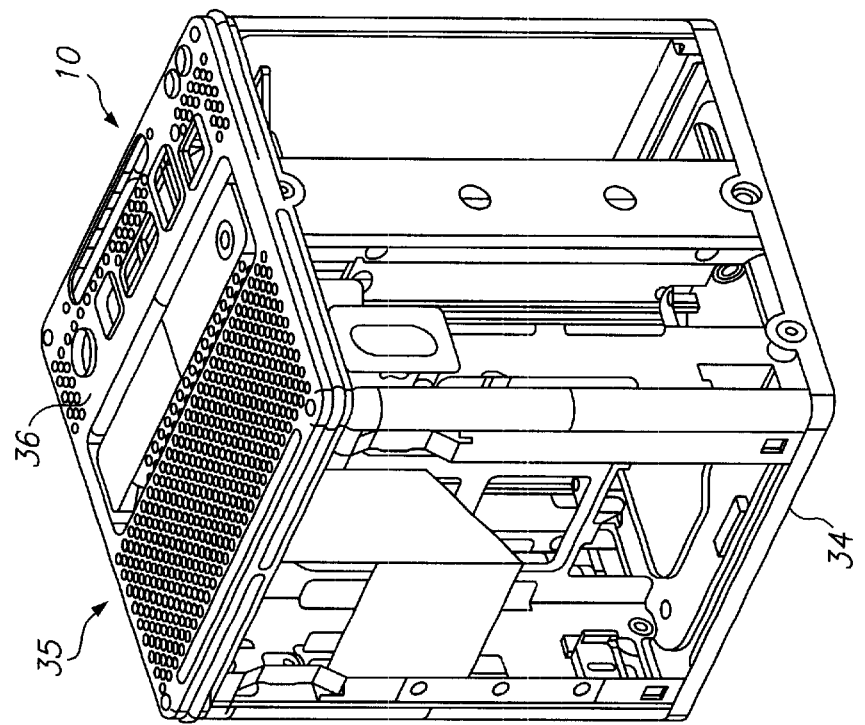
FIGS. 2A and 2B are perspective views of a core structure of the computer shown in FIGS. 1A and 1B.
Figure 2A:
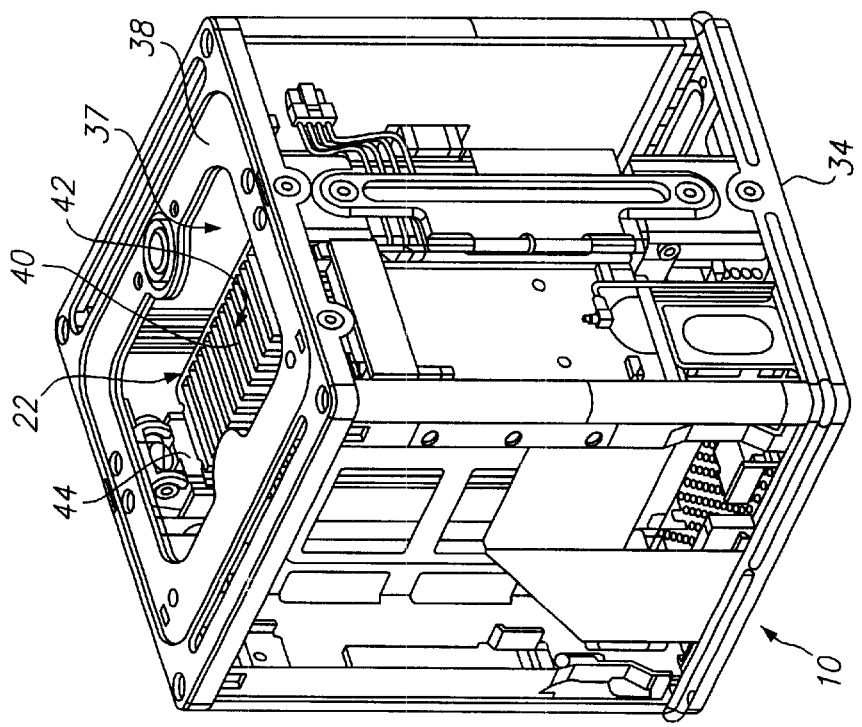
Figure 3A:
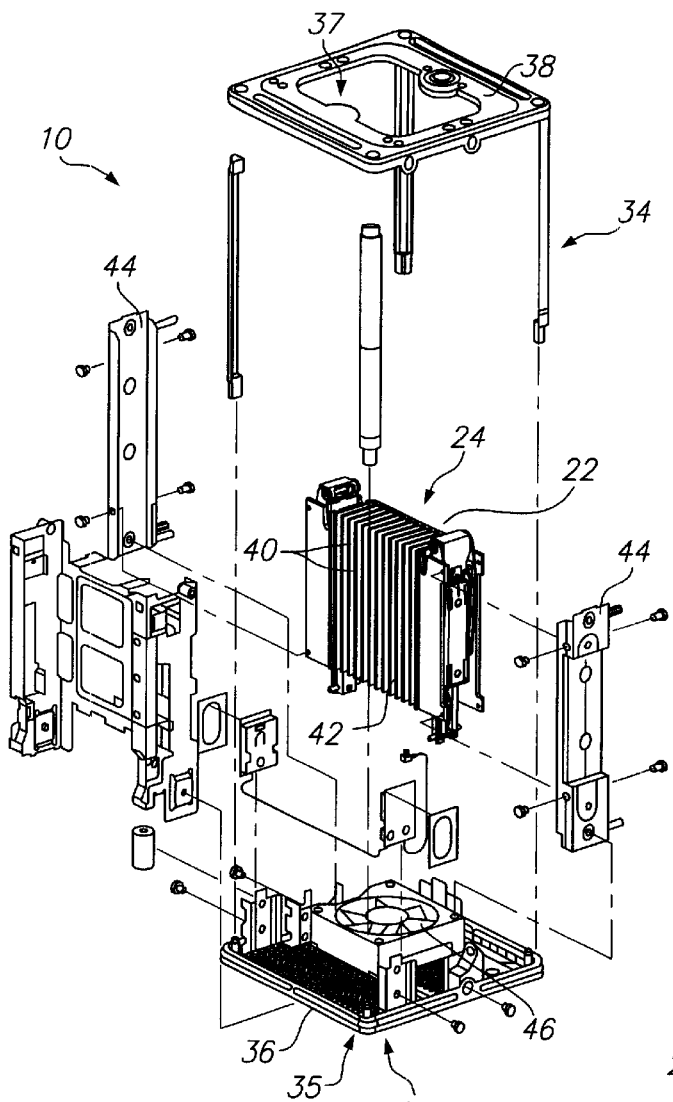
FIGS. 3A and 3B are exploded views thereof.
Figure 3B:
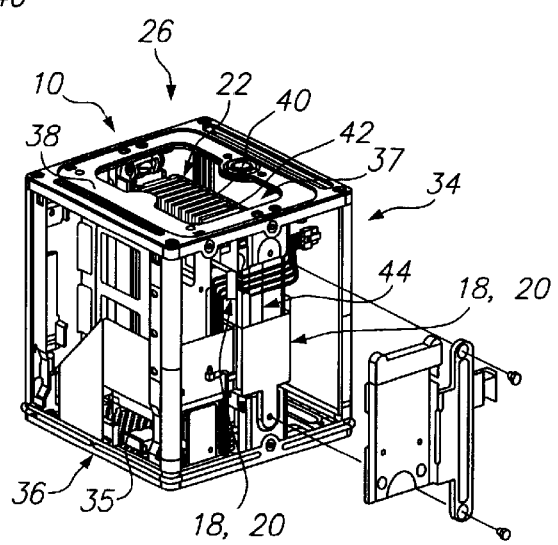

Referring to FIGS. 1A and 1B, a computer C including the heat removal system of the present invention comprises a casing 12 having an opening 14 in an exterior surface 16 thereof. Additionally, the computer C preferably includes a hard drive 18, a microprocessor 20, a heat sink 22, and a spreader plate 24. The heat sink 22 is preferably arranged between the hard drive 18 and the microprocessor 22 for maximum effectiveness and is aligned with the opening 14 in the casing 12 so as to form a thermal chimney 26. The spreader plate 24 is disposed between the microprocessor 20 and the heat sink 22 so as to conduct heat from the microprocessor 20 to the heat sink 22. The hard drive 18 is preferably connected directly to the heat sink 22.

As the computer system operates, the microprocessor 20 and the hard drive 18 generate heat. Heat is transferred from the microprocessor 20 to the heat sink 22, by conduction, through the spreader plate 24. Heat is also directly transferred by conduction from the hard drive 18 to the heat sink 22. As the heat sink 22 becomes hot, air immediately surrounding the heat sink 22 will be heated. The heat sink 22 is preferably located directly below the opening 14 in the exterior surface 16 of the casing 12. The hot air immediately surrounding the heat sink 22 will rise up along the sides of the heat sink 22 and finally out of the opening 14 formed in the external surface 16 of the casing 12. This area including the heat sink 22 and the space directly below the opening 14 thus defines a thermal chimney 26 through which the hot air rises. As illustrated, the chimney 26 is preferably vertically disposed within a central location in the casing 12; however, other locations and orientations are of course possible as well.

As hot air escapes, cooler air will be drawn into the casing 12. Preferably, there is at least one other opening 30 in the casing 12 through which cooler air enters the casing 12. Air thereby circulates through the casing 12 to transfer heat out of the computer system using well known thermodynamic principles and a fan is not required to cool the components, although one could also be provided to enhance the cooling effect, as shown by fan 46. As a result, heat removal is a silent, efficient process which can be incorporated into compact computer designs.

According to the present invention, the casing 12 encloses a computer system, other electronic components, or the like. The casing 12 preferably has an opening 14 in the top exterior surface 16 thereof to allow air to escape from inside the casing 12. The opening may be covered by a grate 28 which allows air to freely escape, but prevents larger objects from penetrating into the casing 12. The casing 12 can be made from either metal or plastic depending upon the particular performance and aesthetic characteristics that are desired. The casing 12 also preferably has a second opening 30 or a defined cut out in an external surface thereof for facilitating air intake. In an exemplary embodiment of the invention, as shown best in FIG. 1A, second opening 30 is in a lower portion of one of the side surfaces 32 of the casing 12. Openings 14, 30 in the casing 12 allow for air to freely circulate through the casing 12 and thereby cool the components housed therewithin.

In a preferred embodiment of the invention, the casing 12 encloses a core structure 34 which supports components of the computer system, such as the microprocessor, the hard drive, and the like. The core structure 34 also includes areas in air communication with and preferably aligned with the openings 14, 30 in the casing 12 which allow for air flow. In a preferred embodiment of the invention, the core structure 34 includes multiple openings 35 in a lower surface 36 thereof to facilitate air intake, and a larger opening 37 in a top surface 38 thereof to allow air to exit. The openings 35, 37 are preferably arranged directly below and directly above the heat sink 22, respectively. More preferably, and as most clearly shown in FIG. 1B, the core structure 34 is mounted within the casing 12 such that the bottom surface 36 of the core structure is spaced a predetermined distance above the support surface for the casing 12, thus promoting air flow up through the bottom surface 36 of the core structure 34. The core structure 34 is preferably made of metal or other suitable material.

The casing 12 preferably encloses the heat sink 22. The heat sink 22 is preferably arranged in a central location within the computer system. The heat sink 22 may be made of metal or any other material suitable for conducting heat efficiently. The heat sink preferably has a plurality of fins 40. The fins 40 are arranged to allow air to flow near the fin surfaces 42. The air flow past the fins 40 removes heat from the heat sink 22 and allows the hot air to escape through the opening 14 in the casing 12. The heat sink 22 is preferably enclosed in the core structure 34 and held in place by one or more heat sink holders 44, which are preferably a bracket assembly of the core structure 34.

The casing 12 encloses the microprocessor 20, the hard drive 18, and other components of the computer system. These components are well known in the art. Many computer components give off heat during operation of the computer. Components that give off heat are preferably placed near or in contact with the heat sink 22 to facilitate heat dispersal. The hard drive 18 is preferably disposed directly adjacent to the heat sink 22. A spreader plate 24 is preferably fixed between the microprocessor 20 and the heat sink 22. The spreader plate 24 preferably is made of metal or another material which can conductively draw heat from the microprocessor to the heat sink. Other components that give off heat, such as disk drives, may be placed in direct contact with the heat sink 22, or alternatively, may be located near the heat sink 22. Placing components near the heat sink 22 allows for convective transfer of the heat generated by these components into the air that is circulating through the casing 12.

The heat sink 22 is aligned with the opening 14 in the casing 12 so as to form the outlet for the thermal chimney 26. By concentrating the heat generated by the computer components in the heat sink 22, the air surrounding the heat sink is heated. The hot air rises along the heat sink 22 and exits through the opening 14 in the casing 12. As hot air escapes from the system, cooler air is preferably drawn into the system. The section of the computer system through which the air circulates defines the thermal chimney 26. Preferably, air naturally enters the thermal chimney 26, it is heated by components of the computer, and it naturally exits out of the thermal chimney 26. The thermal chimney 26 is preferably a generally vertical column. Heat generated by the various components of the computer is preferably concentrated in the heat sink 22, which should therefore be located along an open column of air within the thermal chimney 26.

While the invention has been described in detail with reference to preferred embodiments thereof, it will be apparent to one skilled in the art that various changes can be made, and equivalents employed, without departing from the scope of the invention, which is to be limited only by the claims appended hereto.

What is claimed is:

1. A computer heat removal system comprising:
   a computer casing enclosing a core structure including a hard drive and a microprocessor, said casing including at least one opening in an exterior surface thereof;
   a heat sink positioned between the hard drive and the microprocessor, said heat sink being aligned with said at least one opening in said casing so as to define a thermal chimney for the flow of air; and
   a spreader plate disposed between the microprocessor and said heat sink, said spreader plate conducting heat from the microprocessor to said heat sink.

2. A heat removal system in accordance with claim 1, wherein said at least one opening in said casing comprises two openings, a first opening being provided to allow cooling air to enter said casing and a second opening being provided to allow heated air to exit said casing.

3. A heat removal system in accordance with claim 2, wherein said core includes an air passage in communication with said first and second openings in the casing.

4. A heat removal system in accordance with claim 2, wherein said second opening is disposed on an upper surface of said casing.

5. A heat removal system in accordance with claim 4, wherein said first opening is disposed on a lower portion of a side surface of said casing.

6. A heat removal system in accordance with claim 2, wherein said core structure is disposed within the casing such that a bottom surface of said core structure is positioned a predetermined height above a lower edge surface of said casing.

7. A heat removal system in accordance with claim 6, wherein said lower edge surface of said casing is provided for supporting said casing on a support surface and said bottom surface of said core structure is positioned above said support surface so as to define an air intake space, said first opening in said casing allowing air to enter said air intake space.

8. A method of cooling a computer system, comprising the steps of:
   providing a casing having at least two openings in an exterior surface thereof for supporting the computer system on a support structure, the computer system including a plurality of heat generating components;
   arranging the heat generating components of the computer system along an open air passage aligned with at least one of said openings in the casing; and
   arranging a heat sink within said open air passage and between the heat generating components of the computer system, said heat sink drawing heat away from said heat generating components of the computer system during use;
   whereby air heated by said heat sink escapes out from the casing through one of said at least two openings while cooler air is drawn into the casing through another of said at least two openings, thereby circulating air through the casing to cool the computer system during use.

9. A method of cooling a computer system in accordance with claim 8, wherein said open air passage is a generally vertical passage within the computer system.

10. A method of cooling a computer system in accordance with claim 9, further comprising providing one of said at least two openings in an upper surface of said casing.

11. A method of cooling a computer system in accordance with claim 10, further comprising forming an air intake space below the heat generating components of the computer system.

12. A method of cooling a computer system in accordance with claim 11, wherein said heat generating components are positioned within said casing at a predetermined height above the support surface, said air intake space being defined between the support surface and the heat generating components.

13. A heat removal system for a computer system comprising:
a casing for enclosing a heat generating component of a computer system, said casing including at least two openings in a n exterior surface t hereof,
an air passage formed through said casing; and
a heat sink positioned within said air passage and aligned with at least one of said at least two opening in said casing, said heat sink arranged for conductively drawing heat from said heat generating component during use;
wherein a first one of said at least two openings defines an air intake and a second one of said at least two opening defines an air outlet such that, during use, air circulates through said casing due to heated air naturally rising and exiting said casing through said second opening while cooler air is naturally drawn into said casing through said first opening.

14. A heat removal system in accordance with claim 13, wherein said second opening is disposed in an upper surface of said casing.

15. A heat removal system in accordance with claim 14, wherein said air passage allows for a generally vertical flow of air through said casing.

16. A heat removal system in accordance with claim 13, wherein said casing include four side walls and an upper surface, said casing being supported by a lower edge of said side walls.

17. A heat removal system in accordance with claim 16, wherein said second opening is disposed in said upper surface of said casing and said first opening is disposed in a lower portion of one of said side walls.

18. A heat removal system in accordance with claim 17, wherein an air intake space is defined below said air passage.

19. A heat removal system in accordance with claim 18, wherein said first opening immediately adjoins said air intake space.

20. A heat removal system in accordance with claim 13, wherein said second opening is disposed in an upper surface of said casing and said heat sink is aligned with said second opening.

21. A method of cooling a computer system in accordance with claim 8, further comprising arranging a spreader plate between one of the heat generating components and the heat sink, said spreader plate conducting heat from said one of the heat generating components to the heat sink.

* * * * *